United States Patent [19]

Kitazawa

[11] Patent Number: 4,709,352

[45] Date of Patent: Nov. 24, 1987

[54] MOS READ-ONLY MEMORY SYSTEMS

[75] Inventor: Shooji Kitazawa, Tokyo, Japan

[73] Assignee: OKI Electric Industry Co., Ltd., Tokyo, Japan

[21] Appl. No.: 798,681

[22] Filed: Nov. 15, 1985

[30] Foreign Application Priority Data

Nov. 19, 1984 [JP] Japan .............................. 59-245586
Nov. 28, 1984 [JP] Japan .............................. 59-251046

[51] Int. Cl.$^4$ .......................................... G11C 17/00
[52] U.S. Cl. .................................. 365/104; 365/210
[58] Field of Search ............... 365/104, 185, 189, 207, 365/210

[56] References Cited

U.S. PATENT DOCUMENTS 4,366,555 12/1982 Hu ........................................ 365/185
4,425,632 1/1984 Iwahashi et al. ..................... 365/189
4,592,021 5/1986 Suzuki et al. ........................ 365/189

Primary Examiner—Joseph A. Popek
Attorney, Agent, or Firm—Wenderoth, Lind & Ponack

[57] ABSTRACT

A MOS ROM system is arranged such that during a readout operation a current flows from at least one data line selected from among a plurality of data lines. The read and sense circuit detects a memory state of a selected memory cell based on the amount of inflow current. A non-selected memory cell does not contribute to a word line load capacitance, and the word line load capacitance upon switching word lines can be reduced. A signal transfer rate can therefore be increased, and a data read rate can thereby be speeded up. Moreover, a read and sense circuit for a ROM is adapted such that first and third MOS transistors and a first current supply circuit, and second and fourth MOS transistors and a second current supply circuit are associated with each other, and each connected in series betweeen a low supply voltage and high supply voltage. The input side of the ROM can be kept at a stabilized low potential, and information stored in a selected memory element can be read out based on the value of an inflow current into the read and sense circuit.

12 Claims, 7 Drawing Figures

MOS READ-ONLY MEMORY SYSTEMS

BACKGROUND OF THE INVENTION

1. Field of the Invention

The present invention relates to a read-only memory system (hereinafter simply called a ROM) such as a mask ROM and a PROM, and more particularly, to a MOS ROM circuit having a read and sense amplifier.

2. Description of the Prior Art

Japanese Laid-Open Patent Publication Nos. 59-75495 and 59-77700, and Japanese Patent Publication No. 59-13117, disclose prior art ROM IC devices.

With the increasing packing density of MOS ROM IC devices, it has been difficult to access the contents of selected memory cells at and near the ends of the word lines at a high rate, because of a larger capacitance associated with the word lines. For example, in a 256-bit EPREOM IC in which polysilicon word lines are used, the access delay due to the word lines occupies one third or more of the entire access time, resulting in a decreased read-out speed.

The problem will be described in detail with reference to FIG. 4. In general, a prior art MOS ROM IC device is used with memory MOS transistors each having their source connected to ground (Vss). Now, for example, in a read operation, when a word line decoder 7 selects a word line 3-1 in response to a row address signal 11 while a data line decoder (not shown) selects a data line 4-n in response to a column address signal 12 (not shown), a memory MOS transistor 2-1n becomes conductive, so that a detection current flows from the drain electrode to source electrode. Since the remaining non-selected MOS transistors form inversion layers under the gate insulating layers thereof, the MOS capacitance between the data line and Vss is determined only by the thickness of the gate insulating layer.

The MOS capacitance is very large and forms an RC ladder delay circuit with the resistance of the word line. In the following read operation, when one of the remaining MOS transistors is selected, the word line decoder has to drive a selected word line acting as a heavy load, so that the read-out speed is greatly decreased due to the delay characteristics of the word line.

SUMMARY OF THE INVENTION

It is an object of the present invention to provide an improved MOS ROM system capable of reading the stored contents therein at a high rate of speed.

Another object of the present invention is to provide an improved MOS ROM system including an improved read and sense amplifier.

The achieve the above objects, an MOS system according to the present invention may include:

(a) a memory matrix having a plurality of memory cells, a plurality of data lines and a plurality of word lines; said data lines and said word lines being arranged in a matrix form, each of said memory cells comprising a MOS FET which has a gate electrode connected to each of said word lines, a source electrode connected to each of said data lines and a drain electrode connected to a common line; said common line being connected to a high potential of a power supply;

(b) a word line decoder for selecting one of said word lines in response to a row address signal;

(c) a multiplexer connected to said data lines of said memory matrix and including a plurality of MOS FETs;

(d) a data line decoder for activating one of said plurality of MOS FETs in response to a column address signal to select one of said data lines; and (e) a read and sense circuit having a current input terminal connected to said multiplexer and an output terminal for detecting and amplifying a current from said multiplexer through a specific memory cell in said memory matrix selected by said row address signal and said column address signal to deliver a data signal to said output terminal.

Such an MOS ROM system may also include:

(a) a memory matrix having a plurality of memory cells, a plurality of data lines and a plurality of word lines, said data lines and said word lines being arranged in a matrix form, each of said memory cells comprising a MOS FET which has a gate electrode connected to each of said word lines, a source electrode connected to each of said data lines and a drain electrode connected to a first common line; said common line being connected to a high potential of a first supply;

(b) a word line decoder for selecting one of said word lines in response to a row address signal;

(c) a multiplexer connected to said data lines of said memory matrix and including a plurality of MOS FETs;

(d) a data line decoder for activating one of said plurality of MOS FETs in response to a column address signal to select one of said data lines;

(e) a plurality of load means each connected between each of said data lines and a second common line for suppressing a voltage drop on unselected data lines during a read operation; and (f) a read and sense circuit having a current input terminal connected to said multiplexer and an output terminal for detecting and amplifying a current from said multiplexer through a specific memory cell in said memory matrix selected by said row address signal and said column address signal to deliver a data signal to said output terminal.

The above and other objects, features and advantages of the present invention will become more apparent from the following description when taken in conjunction with the accompanying drawings in which preferred embodiment of the present invention is shown by way of illustrative example.

DESCRIPTION OF THE PREFERRED EMBODIMENT

An MOS ROM system according to the present invention will be described below with reference to FIGS. 1 to 3.

Figure 1:
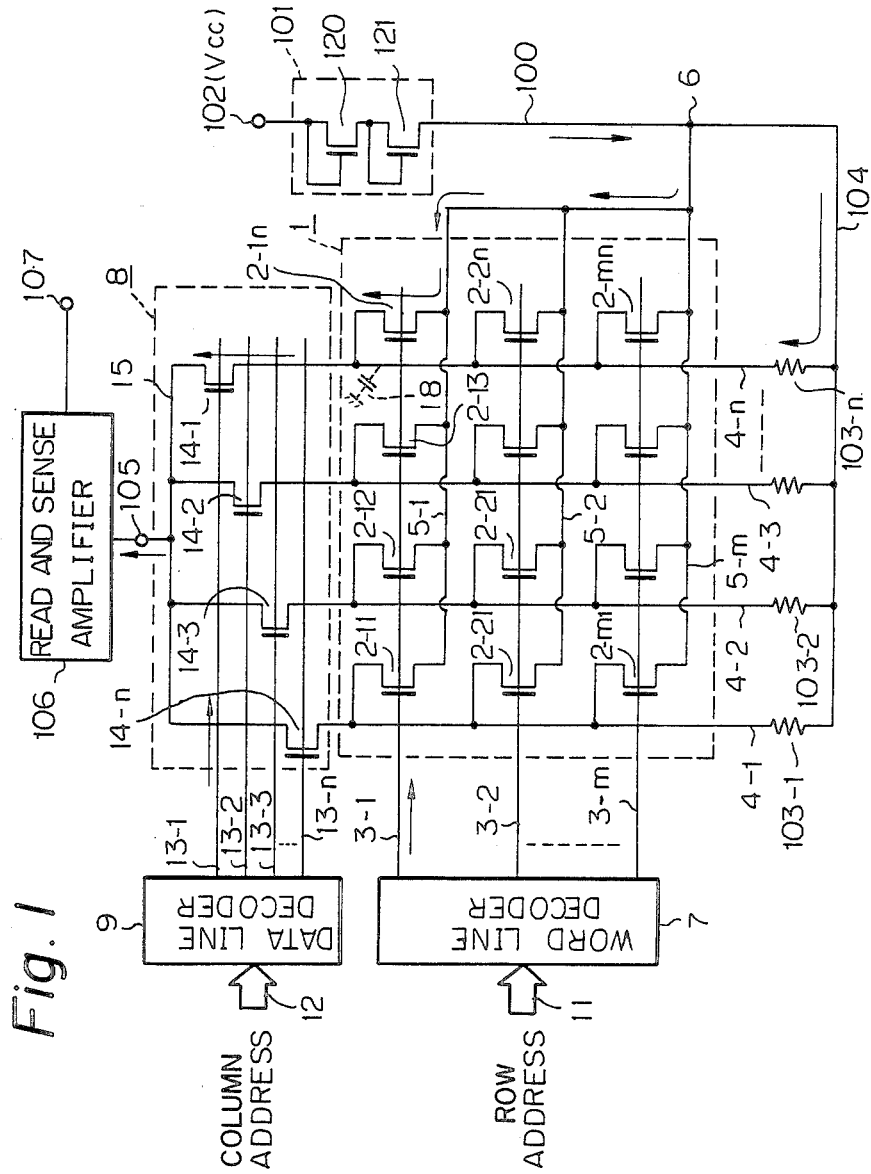
FIG. 1 is a block diagram illustrating an embodiment of an MOS ROM system of the present invention.

As shown in FIG. 1, a memory cell matrix 1 includes memory cells 2-11-2-1n, ..., 2-m1-2-mn arranged in a matrix form, each of which comprises for example an enhancement type N-channel MOS FET transistor. A plurality of word lines 3-1-3-m made of polysilicon, etc., are disposed in a row direction in the memory cell matrix 1, while a plurality of data lines 4-1-4-n made of aluminum, etc., are arranged in a column direction in the matrix 1. Each of the word lines 3-1-3-m is connected to gates of each group of memory cells 2-11-2-1n, ..., 2-m1-2-mn in the row direction, while each of the data lines 4-1-4-n is connected to sources of each group of memory cells 2-11-2-m1, ..., 2-1n-2-mn in the column direction. All the drains of the memory cells 2-11-2-mn in the memory matrix 1 are connected to common lines 5-1, ..., 5-m. The information of the memory cell is represented by its conductive or non-conductive state. Such conditions are obtained by changing the electrical connection between a data line of the gate of a memory cell, or the threshold voltage of a memory cell.

A word line decoder 7 is connected to the word lines 3-1-3-m and decides a ROW address signal 11 to activate a specific one of the word lines 3-1-3-m. A multiplexer 8 is connected to the data lines 4-1-4-n and comprises a plurality of MOS FETs 14-1, ..., 14-n whose sources are connected to a current input terminal 105, and whose drains are each connected to a respective one of the data lines, and whose gate electrodes are each connected to a respective one of output lines 13-1, ..., 13-n.

The multiplexer 8 selects one of the data lines 4-1-4-n in response to a column address signal 12. A data line decoder 9 is connected to the output lines 13-1-13-n to activate a specific one of the output lines in response to a column address signal 12.

A voltage reducing circuit 101 is connected between the common line 5 and a power source terminal 102 to provide an intermediate potential (for example, +3 V) between a higher fixed potential Vcc (for example, +5 V) and a lower fixed potential Vss (for example, 0 V) to the common lines 5-1-5-m.

Resistors 103-1, 103-2, ..., 103-n, used as loads, are connected between the voltage reducing circuit 101 and the data lines 4-1-4-n to prevent the voltage drop during a read operation of an unselected data line due to a leakage current through the PN junction of the memory cell connected to the unselected data line.

The resistors 103-1-103-n are selected so as to have a larger resistance value than the ON resistance component of a memory cell. The loads may be replaced by MOS FETs which each conduct when a data line is unselected in a read operation and which do not conduct when a data line is selected.

A read and sense amplifier circuit 106 is connected to the multiplexer 8 and detects and amplifies a current from a specific memory cell in the memory matrix 1 which is selected by the decoders 7 and 9. For example, when the read and sense amplifier circuit 106 receives a current from the multiplexer 8 in a read operation, it provides an "H" level signal to the output terminal 107. On the other hand, when there is no current at the terminal 105, the circuit 106 provides an "L" level signal to the terminal 107.

Figure 2:
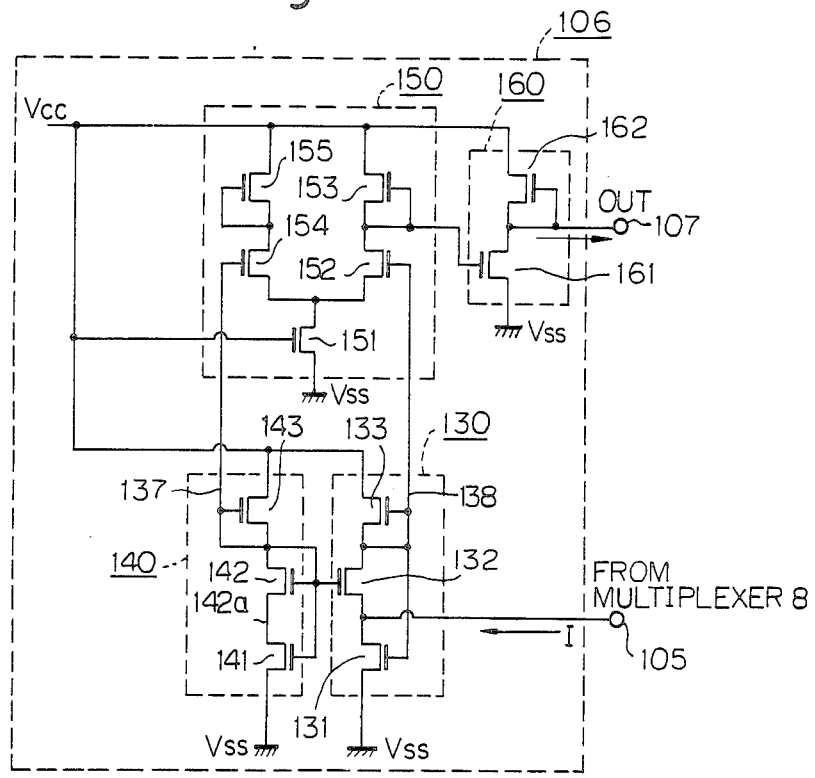
FIG. 2 is a circuit diagram of a read and sense circuit used in the ROM system in FIG. 1.

As shown in FIG. 2, the read and sense circuit 106 comprises a current to voltage converter 130 for converting a detection current from the input terminal 105 to voltage, and a reference voltage generating circuit 140 for producing a reference voltage for the converter 130, and a differential amplifier 150 for amplifying an output voltage difference between the converter 130 and the reference voltage circuit 140, and an output circuit 160 for amplifying an output signal from the differential amplifier 150 and to deliver the signal the output terminal 107.

The converter 130 comprises enhancement type MOS FETs 131 and 132 and a depletion type MOS FET 133 connected in series with each other. The MOS FET 131 has a gate electrode, a source electrode connected to the Vss potential, and a drain electrode connected to the terminal 105. The MOS FET 132 has a gate electrode, a source electrode connected to the terminal 105, and a drain electrode. The MOS FET 133 has a source electrode connected to the drain electrode of the MOS FET 132, a gate electrode connected to line 138, and a drain electrode connected to the Vcc potential.

The reference voltage generating circuit 140 comprises enhancement type MOS FETs 141 and 142, and a depletion type MOS FET 143 connected in series with each other. The MOS FET 141 has a gate electrode, a drain electrode and a source electrode connected to the potential Vss. The MOS FET 142 has drain and gate electrodes connected to the line 137 and to the gate electrodes of the MOS FETs 132 and 141, and a source electrode connected to the drain electrode of the MOS FET 141. The MOS FET 143 has gate and source electrodes connected to the line 137, and a drain electrode connected to the potential Vcc.

The differential amplifier 150 comprises a plurality of MOS FETs 151, 152, 153, 154 and 155. The MOS FET 151 has a drain electrode, a gate electrode connected to the potential Vcc, and a source electrode connected to the potential Vss. The MOS FET 154 has a drain electrode, a gate electrode connected to the line 137, and a source electrode connected to the drain electrode of the MOS FET 151. The MOS FET 152 has a drain electrode, a gate electrode connected to the line 138, and a source electrode connected to the drain electrode of the MOS FET 151. The MOS FET 155 has a gate and source electrodes commonly connected to the drain electrode of the MOS FET 154, and a drain electrode connected to the potential Vcc. The MOS FET 154 has a drain electrode connected to the Vcc potential, a source electrode connected to the drain electrode of the MOS FET 152, and a gate electrode connected to the source electrode of the MOS FET 152.

The output circuit 160 comprises an enhancement type MOS FET 161 having a source electrode connected to the Vss potential, a gate electrode connected to the drain electrode of the MOS FET 152, and a drain electrode connected to an output terminal 107, and a depletion type MOS FET 162 having source and gate electrodes connected to the output terminal 107 and a drain electrode connected to the Vcc potential.

In a current sensing circuit comprising the circuits 130 and 140, if the MOS FETs 131, 132, 133, 142 and 143 are formed with the same dimensions, the same signal levels will appear on the two lines 137 and 138, resulting in an indefinite logical condition on the output terminal 107.

In order to prevent this problem, the MOS FET 131 is formed so as to be larger than the MOS FET 141 so as to provide a larger current sink capability, while the remaining MOS FETs 132, 133, 142 and 143 are formed so as to provide the same electrical characteristics.

In this condition, when there is no current at the terminal 105, the potential on the line 138 becomes lower than that of the line 137, so that an "L" level signal appears on the terminal 107. On the other hand, when the terminal 105 receives a current I, the potential of the line 138 increases in proportion to the current. Then, an "H" level signal will appear on the terminal 107, when the potential of the line 138 exceeds that on the line 137.

The operation of the MOS ROM system according to this invention will be explained with reference to FIGS. 1, 2 and 3.

First, it is assumed that the memory cell 2-21 is selected by the word line decoder 7 and the data line decoder 9, the selected data line 4-2 is at the ground potential, and the remaining unselected data lines are at an intermediate potential (for example, +3 V).

In the following read operation, when the decoder 9 selects the data line 13-1 in response to a column address signal 12, the MOS FET 14-1 is activated so as to connect the data line 4-n to the terminal 105. At the same time, when the decoder 7 selects the word line 3-1 in response to a ROW address signal 11, a group of the memory cells associated with the word line 3-1 are activated at a higher potential (for example, +5 V). At a starting point of the read operation, the intermediate potential (+3 V) makes the MOS FET 132 of the converter 130 turn off, and boosts the voltage of the line 138 to the Vcc potential (+5 V), thus lowering the ON resistance of the MOS FET 131.

Since the MOS FET 131 improves its sink current drive capability, electric charges stored in the stray capacitance 18 associated with the data line 4-n are quickly discharged to the Vss potential through the MOS FET 131. Then, the selected data line 4-n is connected to the Vss potential and the output circuit 160 provides an "H" level signal to the terminal 107.

Figure 3:
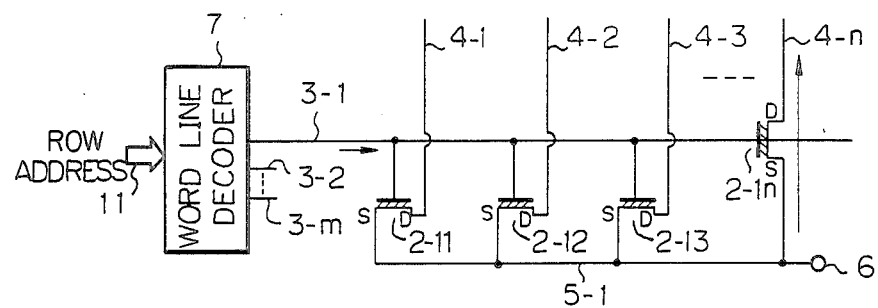
FIG. 3 is a view showing the operation of memory cell transistors in FIG. 1.
Figure 4:
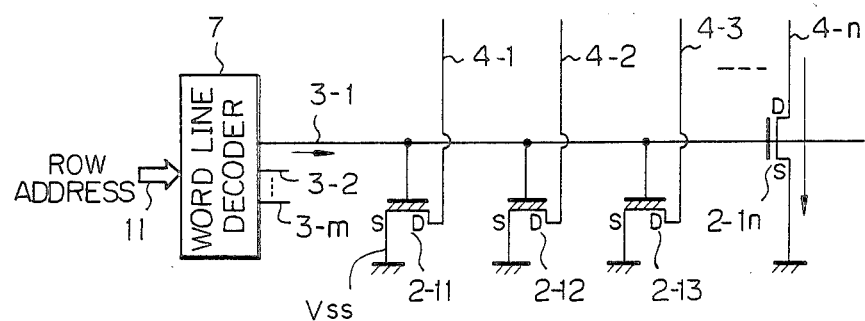
FIG. 4 is a view showing the operation of the memory cell transistors of a prior art MOS ROM system.

As shown in FIG. 3, since the word line 3-1 is maintained at a higher potential (+5 V), a depletion layer capacitance is formed under the gate insulating layer of the unselected memory cell and is serially coupled to the MOS capacitance determined by the thickness of the gate insulating layer.

This provides a small parasitic a small parasitic capacitance value associated to the data line 3-1. This advantage improves the drive capability of the word line decoder 7, because the word line acts as a light load. Therefore, read and sense operations have a greatly improved speed.

In the embodiment, the common line 5-1 and the data lines 4-1-4-n may have different higher fixed potentials respectively supplied thereto, under the condition that a depletion capacitance layer is formed under the gate insulating layer of each of the memory cells associated with unselected data lines.

Furthermore, the potential (for example, +5 V) of the word lines may be the same of that of the common lines 3-1–3-m. In this case, the sense and read operation may have a decreased speed because of the large voltage swing between the selected word line and the unselected data line.

Figure 5:
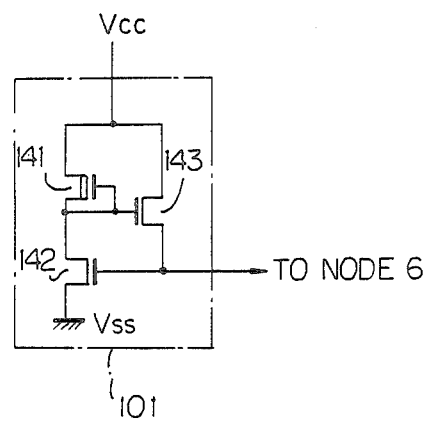
FIG. 5 is a circuit diagram showing another embodiment of a voltage reducing circuit used in the read and sense circuit in FIG. 2.

FIG. 5 is another embodiment of the voltage reducing circuit having a constant output voltage characteristics. In FIG. 5, a voltage reducing circuit 101 comprises a depletion type MOS FET 141 having a drain electrode connected to the Vcc voltage, a gate electrode, and a source electrode connected to the gate electrode, an enhancement MOS FET 142 having a gate electrode connected to the node 6, a drain electrode connected to the source electrode of the MOS FET 141, and a drain electrode connected to the Vss voltage, and an enhancement MOS FET 143 having a drain electrode connected to the Vcc voltage, a gate electrode connected to the source electrode of the MOS FET 141, and a source electrode connected to the node 6. The voltage reducing circuit 101 can provide a reduced stable middle voltage (Vcc+Vss/2) to the node 6.

Figure 6:
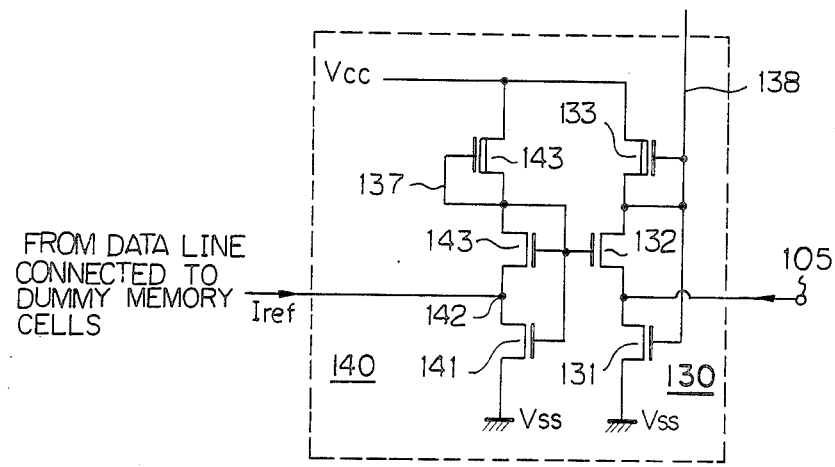
FIG. 6 is a second embodiment of a current sense circuit used in the read and sense circuit in FIG. 2.
Figure 7:
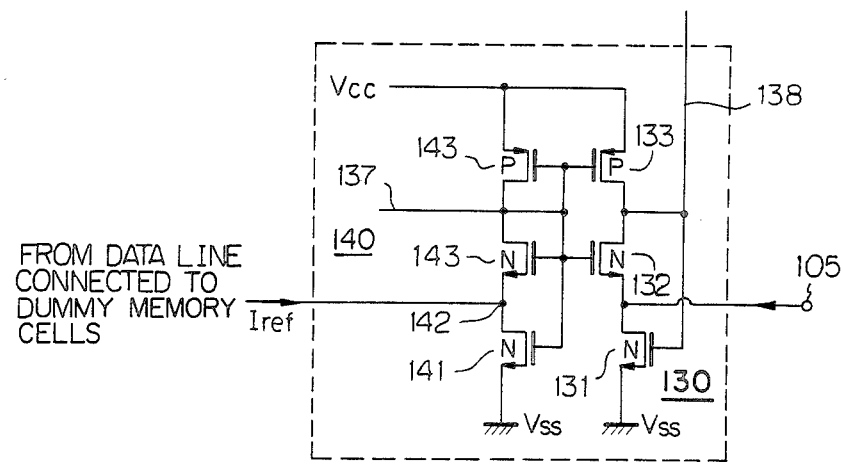
FIG. 7 is a third embodiment of a current sense circuit used in the read and sense circuit in FIG. 2.

FIGS. 6 and 7 show another embodiment of the current sensing circuit used in the read and sense circuit 106.

In FIG. 6, the circuit structure of the current to voltage converter 130 is the same as that shown in FIG. 2. The MOS FET 131 may be formed in the same size as the MOS FET 141. The reference circuit 140 is the same as that in FIG. 2. However, the drain electrode of the MOS FET 141 is connected to a data line associated with dummy memory cells (not shown) in the memory matrix. A reference current Iref is supplied to the node 142, and varies with a detection current from the terminal 105. This feature provides a stable output signal irrespective of Vcc variations to the differential amplifier 150.

FIG. 7 shows still another embodiment of the current sensing circuit used in the read and sense circuit 106. In FIG. 7, the current sensing circuit is constructed in complementary MOS (CMOS) circuit structure, and comprises P-channel MOS FETs 133 and 143, and N-channel MOS FETs 131, 132, 142 and 143. The node 142 is connected to a data line associated with dummy memory cells (not shown) in the memory matrix 1 to receive a reference current Iref.

As described above, the MOS ROM system according to this invention has a great number of features in operation. Particularly, the outstanding advantages obtained in the MOS ROM system are as follows:

(a) Since the MOS ROM system includes an improved read and sense circuit which receives a current through a selected memory cell, a group of unselected memory cells associated with a selected word line do not become a large load capacitance with respect to the word line decoder. The word line decoder does not require a large current drive capability for the word line.

(b) The read sense circuit used in the MOS ROM has a large sink current drive capability, so that a selected data line can be coupled to the Vss potential at a high speed in a read operation.

(c) Since the unselected data lines are supplied with a high potential of a power supply through load means, a load capacitance associated with a selected word line is greatly decreased.

(d) The common line and unselected data lines are supplied with an intermediate potential (for example, +3 V) which is lower than a higher potential (for example, +5 V) on the word line. This makes it possible to operate a selected memory cell at a high rate of speed in a read operation.

Although certain preferred embodiments have been shown and described, it should be understood that many changes and modifications may be made therein without departing from the scope of the appended claims.

What is claimed is:
1. An MOS read-only-memory system comprising:
(a) a memory matrix having a plurality of memory cells, a plurality of data lines and a plurality of word lines; said data lines and said word lines being arranged in a matrix form, each of said memory cells comprising a MOS FET which has a gate electrode connected to each of said word lines, a source electrode connected to each of said data lines and a drain electrode connected to a common line; said common line being connected to a high potential of a power supply;

(b) a word line decoder for selecting one of said word lines in response to a row address signal;

(c) a multiplexer connected to said data lines of said memory matrix and including a plurality of MOS FETs;

(d) a data line decoder for activating one of said plurality of MOS FETs in response to a column address signal to select one of said data lines; and (e) a read and sense circuit having a current input terminal connected to said multiplexer and an output terminal for detecting and amplifying a current from said multiplexer through a specific memory cell in said memory matrix selected by said row address signal and said column address signal to deliver a data signal to said output terminal.

2. An MOS ROM system comprising:

(a) a memory matrix having a plurality of memory cells, a plurality of data lines and a plurality of word lines, said data lines and said word lines being arranged in a matrix form, each of said memory cells comprising a MOS FET which has a gate electrode connected to each of said word lines, a source electrode connected to each of said data lines and a drain electrode connected to a first common line; said common line being connected to a high potential of a first supply;

(b) a word line decoder for selecting one of said word lines in response to a row address signal;

(c) a multiplexer connected to said data lines of said memory matrix and including a plurality of MOS FETs;

(d) a data line decoder for activating one of said plurality of MOS FETs in response to a column address signal to select one of said data lines;

(e) a plurality of load means each connected between each of said data lines and a second common line for suppressing a voltage drop on unselected data lines during a read operation; and (f) a read and sense circuit having a current input terminal connected to said multiplexer and an output terminal for detecting and amplifying a current from said multiplexer through a specific memory cell in said memory matrix selected by said row address signal and said column address signal to deliver a data signal to said output terminal.

3. An MOS ROM system according to claim 2, wherein said first and second common lines are supplied with a high potential of a power supply.

4. An MOS ROM system according to claim 2, further including voltage reducing means connected between a power supply and both said first and second common lines for providing a reduced high potential such that there is an absence of an inversion layer under a gate insulating layer of each of unselected memory cells associated with a selected word line during a read operation.

5. An MOS ROM system according to claim 4, wherein said voltage reducing means comprises a plurality of MOS FETs which are serially connected with each other, each of said plurality of MOS FETs having its source electrode and its drain electrode connected to its gate electrode.

6. An MOS ROM system according to claim 4, wherein said voltage reducing means comprises a depletion MOS FET having a drain electrode connected to said power supply, a gate electrode and a source electrode connected to said gate electrode, a first enhancement MOS FET having a gate electrode, a drain electrode connected to said source electrode of said depletion MOS FET and a source electrode connected to a low fixed potential of said power supply, and a second enhancement MOS FET having a drain electrode connected to a high fixed potential of said power supply, a gate electrode connected to said source electrode of said depletion MOS FET, and a source electrode connected to said current input terminal and to said gate electrode of said first enhancement MOS FET.

7. An MOS ROM system according to claim 2, wherein said read and sense circuit comprises:

(a) a current sensing means connected to said current input terminal for providing a reference voltage and a voltage obtained by converting a current from said multiplexer, said current sensing means comprising a current to voltage converter connected to said current input terminal for converting said current from said multiplexer into a voltage, and a reference voltage generating circuit connected to said current to voltage converter;

(b) a differential amplifier connected to said current sensing means for amplifying a voltage difference between said reference voltage and said converted voltage from said current to voltage converter; and (c) an output circuit connected to said differential amplifier for providing said data signal to said output terminal.

8. An MOS ROM system according to claim 7, wherein said current to voltage converter in said current sensing means comprises a first enhancement MOS FET having a gate electrode, a drain electrode connected to said current input terminal and a source electrode connected to a low fixed potential of a power supply, a second enhancement MOS FET having a source electrode connected to said current input terminal, a drain electrode connected to said gate electrode of said first MOS FET and a gate electrode connected to said reference voltage generating circuit, and a depletion MOS FET having a drain electrode connected to a high fixed potential of said power supply, a source electrode connected to said drain electrode of said second MOS FET and a gate electrode connected to said drain electrode of said second MOS FET and to said gate electrode of said third MOS FET in said differential amplifier.

9. An MOS ROM system according to claim 8, wherein said reference voltage generating circuit comprises a first enhancement MOS FET having a source electrode connected to said low fixed potential, a drain electrode and a gate electrode connected to said gate electrode of said second MOS FET in said current to voltage converter, a second enhancement MOS FET having a source electrode connected to said drain electrode of said first MOS FET, a drain electrode and a gate electrode connected to said gate electrode of said first MOS FET and to said drain electrode, and a depletion MOS FET having a drain electrode connected to said high fixed potential, a source electrode connected to said drain electrode of said second MOS FET and a gate electrode connected to said gate electrode of said second MOS FET.

10. An MOS ROM system according to claim 8, wherein said reference voltage generating circuit comprises a first enhancement MOS FET having a source electrode connected to said low fixed potential, a gate electrode connected to the gate electrode of said second MOS FET in said current to voltage converter and a drain electrode connected to a data line associated with dummy memory cells, a second enhancement MOS FET having a source electrode connected to said drain electrode of said first MOS FET, a drain electrode and a gate electrode of said first MOS FET, and a depletion MOS FET having a drain electrode connected to said high fixed potential, a source electrode connected to said drain electrode of said second MOS FET and a gate electrode connected to said gate electrode of said second MOS FET.

11. An MOS ROM system according to claim 7, wherein said current to voltage converter in said current sensing means comprises a first N type enhancement MOS FET having a gate electrode connected to said differential amplifier, a drain electrode connected to said current input terminal and a source electrode connected to a low fixed potential of a power supply, a second N type enhancement MOS FET having a source electrode connected to said current input terminal, a drain electrode connected to said gate electrode of said first N type MOS FET and a gate electrode, and a P type enhancement MOS FET having a source electrode connected to a high fixed potential, a drain electrode connected to said drain electrode of said second N type MOS FET, and a gate electrode connected to said gate electrode of said second N type MOS FET; and wherein said reference voltage generating circuit comprises a first N type enhancement MOS FET having a source electrode connected to said low fixed potential, a drain electrode connected to a data line associated with memory dummy cells, and a gate electrode connected to said gate electrode of said second N type MOS FET in said current to voltage converter, a second N type MOS FET having a drain electrode, a source electrode connected to said drain electrode of said first N type MOS FET, and a gate electrode connected to said gate electrode of said first N type MOS FET, a P type enhancement MOS FET having a source electrode connected to said high fixed potential, a gate electrode connected to said gate electrode of said second N type MOS FET, and a source electrode connected to said gate electrode and to said drain electrode of said second N type MOS FET and to said differential amplifier.

12. An MOS ROM system according to claim 7, wherein said differential amplifier comprises a first enhancement MOS FET having a drain electrode, a source electrode connected to a low fixed potential of a power supply, and a gate electrode to a high potential of said power supply, a second enhancement MOS FET having a gate electrode connected to said reference voltage generating circuit, a drain electrode, and a source electrode connected to said drain electrode of said first MOS FET, a third enhancement MOS FET having a drain electrode, a gate electrode connected to said converter, and a source electrode connected to said drain electrode of said MOS FET, a first depletion MOS FET having a drain electrode connected to said high fixed potential, a gate electrode and a source electrode connected to said gate electrode and to said drain electrode of said second MOS FET, and a second depletion MOS FET having a drain electrode connected to said drain electrode of said third MOS FET and a gate electrode connected to said source electrode.

* * * * *